United States Patent
Lee et al.

(10) Patent No.: US 10,937,882 B2
(45) Date of Patent: Mar. 2, 2021

(54) SEMICONDUCTOR DEVICE INCLUDING A FIELD EFFECT TRANSISTOR

(71) Applicant: SAMSUNG ELECTRONICS CO., LTD., Suwon-si (KR)

(72) Inventors: Yeonkwang Lee, Hwasung-Si (KR); Sungmin Kang, Hwasung-Si (KR); Kyungmin Kim, Hwasung-Si (KR); Minhee Uh, Hwasung-Si (KR); Jun-Gu Kang, Hwasung-Si (KR); Youngmok Kim, Hwasung-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/595,187

(22) Filed: Oct. 7, 2019

(65) Prior Publication Data
US 2020/0303512 A1 Sep. 24, 2020

(30) Foreign Application Priority Data
Mar. 22, 2019 (KR) .................. 10-2019-0033101

(51) Int. Cl.
| H01L 29/06 | (2006.01) |
| H01L 29/49 | (2006.01) |
| H01L 27/092 | (2006.01) |
| H01L 27/12 | (2006.01) |
| H01L 21/265 | (2006.01) |
| H01L 29/10 | (2006.01) |
| H01L 29/78 | (2006.01) |

(Continued)

(52) U.S. Cl.
CPC .... *H01L 29/4983* (2013.01); *H01L 21/26513* (2013.01); *H01L 27/092* (2013.01); *H01L 27/1207* (2013.01); *H01L 29/0653* (2013.01); *H01L 29/0847* (2013.01); *H01L 29/1087* (2013.01); *H01L 29/6653* (2013.01); *H01L 29/6656* (2013.01); *H01L 29/7838* (2013.01)

(58) Field of Classification Search
CPC ............ H01L 21/26513; H01L 27/092; H01L 27/1207; H01L 29/0653; H01L 29/0847; H01L 29/1087; H01L 29/6653; H01L 29/6656; H01L 29/7838
See application file for complete search history.

(56) References Cited

U.S. PATENT DOCUMENTS

| 8,574,970 | B2 | 11/2013 | Cheng et al. |
| 8,609,497 | B2 | 12/2013 | Chung et al. |

(Continued)

*Primary Examiner* — Thomas L Dickey
(74) *Attorney, Agent, or Firm* — F. Chau & Associates, LLC

(57) ABSTRACT

A semiconductor device includes a substrate, in which a lower semiconductor layer, an insulating gapfill layer, and an upper semiconductor layer are sequentially stacked. A gate structure is disposed on the upper semiconductor layer. A source/drain electrode is disposed on a sidewall of the gate structure. A semiconductor pattern is disposed between the source/drain electrode and the upper semiconductor layer. The gate structure includes a gate electrode and a spacer structure. The spacer structure includes a first spacer pattern, a second spacer pattern, and a third spacer pattern, sequentially disposed on a sidewall of the gate electrode. The semiconductor pattern is extended to a region below a bottom surface of the third spacer pattern and is connected to the second spacer pattern.

25 Claims, 18 Drawing Sheets

(51) Int. Cl.
*H01L 29/66* (2006.01)
*H01L 29/08* (2006.01)

(56) References Cited

U.S. PATENT DOCUMENTS

| | | |
|---|---|---|
| 9,806,170 B1 | 10/2017 | Mulfinger et al. |
| 9,905,479 B2 | 2/2018 | Cheng et al. |
| 10,008,576 B2 | 6/2018 | Mulfinger et al. |
| 2005/0048732 A1 | 3/2005 | Park et al. |
| 2017/0170181 A1 | 6/2017 | Seo |
| 2017/0250261 A1* | 8/2017 | Kim ................. H01L 29/66742 |
| 2018/0294193 A1 | 10/2018 | Czornomaz et al. |

\* cited by examiner

SEMICONDUCTOR DEVICE INCLUDING A FIELD EFFECT TRANSISTOR

CROSS-REFERENCE TO RELATED APPLICATIONS

This U.S. non-provisional patent application claims priority under 35 U.S.C. § 119 to Korean Patent Application No. 10-2019-0033101, filed on Mar. 22, 2019, in the Korean Intellectual Property Office, the entire contents of which are hereby incorporated by reference.

TECHNICAL FIELD

The present disclosure relates to a semiconductor device, and more specifically, to a semiconductor device including a field effect transistor.

DISCUSSION OF THE RELATED ART

Semiconductor devices are widely used in the electronic industry as they may be used to provide a variety of functions, while maintaining a very small form factor. Popular types of semiconductor devices include a memory device for storing data, a logic device for processing data, and a hybrid device for both storing and processing data within a single device.

SUMMARY

An exemplary embodiment of the present inventive concept provides transistors with desired electric characteristics. A method for fabricating a semiconductor device, according to exemplary embodiments of the present inventive concept, may have reduced process variation and complexity. According to exemplary embodiments of the present inventive concept, transistors may be formed having various threshold voltages.

According to an exemplary embodiment of the present inventive concept, a semiconductor device may include a substrate. A lower semiconductor layer, an insulating gapfill layer, and an upper semiconductor layer are sequentially stacked on the substrate. A gate structure is disposed on the upper semiconductor layer. A source/drain electrode is disposed on a sidewall of the gate structure. A semiconductor pattern is disposed between the source/drain electrode and the upper semiconductor layer. The gate structure may include a gate electrode and a spacer structure. The spacer structure may include a first spacer pattern, a second spacer pattern, and a third spacer pattern sequentially disposed on a sidewall of the gate electrode. The semiconductor pattern may extend to a region below a bottom surface of the third spacer pattern and may be connected to the second spacer pattern.

According to an exemplary embodiment of the present inventive concept, a semiconductor device may include a substrate. A lower semiconductor layer, an insulating gapfill layer, and an upper semiconductor layer are sequentially stacked on the substrate. A gate structure is disposed on the upper semiconductor layer. A source/drain electrode is disposed on a sidewall of the gate structure. A semiconductor pattern is disposed between the source/drain electrode and the upper semiconductor layer. The gate structure may include a gate electrode and a spacer structure. The spacer structure may include a first spacer pattern, a second spacer pattern, and a third spacer pattern, which are sequentially disposed on a sidewall of the gate electrode. The semiconductor pattern may include an upper portion, which is connected to a sidewall of the third spacer pattern, and a lower portion, which is extended in a region below a bottom surface of the third spacer pattern and is connected to the second spacer pattern.

According to an exemplary embodiment of the present inventive concept, a semiconductor device may include a substrate. A lower semiconductor layer, an insulating gapfill layer, and an upper semiconductor layer are sequentially stacked on the substrate. A first transistor and a second transistor are disposed on the substrate. The first transistor may include a first gate structure on the upper semiconductor layer, a first source/drain electrode on a sidewall of the first gate structure, and a first semiconductor pattern disposed between the first source/drain electrode and the upper semiconductor layer. The first gate structure may include a gate electrode and a first spacer structure. The first spacer structure may include a first spacer pattern, a second spacer pattern, and a third spacer pattern, which are sequentially disposed on a sidewall of the gate electrode. The first semiconductor pattern may be extended in a region below a bottom surface of the third spacer pattern and may be in contact with the second spacer pattern.

According to an exemplary embodiment of the present inventive concept, a method of fabricating a semiconductor device may include forming a gate electrode on a substrate. A lower semiconductor layer, an insulating gapfill layer, and an upper semiconductor layer are sequentially stacked on the substrate. A first spacer layer and a second spacer layer are sequentially formed on a sidewall of the gate electrode. A first ion implantation process is performed on the upper semiconductor layer. A third spacer pattern is formed on a sidewall of the second spacer layer. A portion of the second spacer layer, which is placed below a bottom surface of the third spacer pattern, is removed to form a recess region. A first semiconductor pattern is grown from the upper semiconductor layer. The first semiconductor pattern extends to the recess region. A second ion implantation process is performed on the first semiconductor pattern and the upper semiconductor layer. The first ion implantation process may be performed before the forming of the third spacer pattern.

BRIEF DESCRIPTION OF THE DRAWINGS

A more complete appreciation of the present disclosure and may of the attendant aspects thereof will be more clearly understood from the following detailed description taken in conjunction with the accompanying drawings, wherein.

DETAILED DESCRIPTION

In describing exemplary embodiments of the present inventive concept, specific terminology is employed for sake of clarity. However, the present disclosure is not intended to be limited to the specific terminology so selected, and it is to be understood that each specific element includes all technical equivalents which operate in a similar manner.

It should be noted that these figures are intended to illustrate exemplary characteristics of methods, structure and/or materials utilized in certain exemplary embodiments of the present inventive concept and to supplement the written description provided below. Elements of these drawings might not be drawn to scale and may be exaggerated for clarity. However, it is to be understood that the precise structural shown, relative sizes and angles may be taken as an example, and so while the present invention is not limited exclusively to the precise structure shown, this shown structure does show at least one exemplary embodiment of the present invention. For example, the relative thicknesses and positioning of molecules, layers, regions and/or structural elements may be reduced or exaggerated for clarity. Moreover, similar or identical reference numbers may be used in the specification and in the various drawings to indicate the presence of a similar or identical element or feature.

Figure 1:
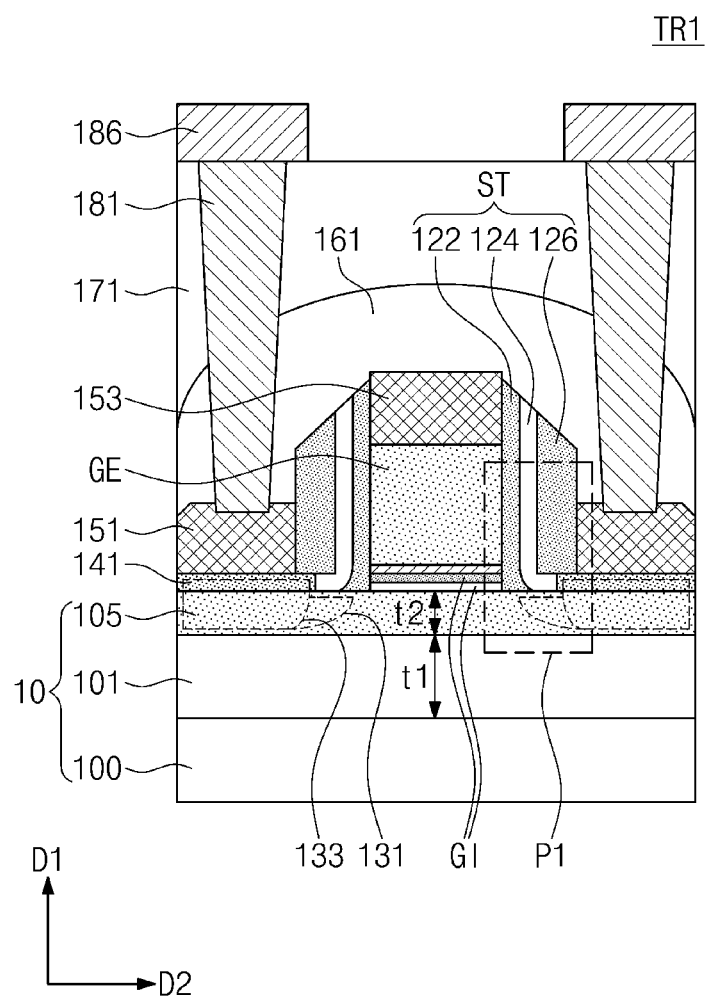
FIG. 1 is a cross-sectional view illustrating a semiconductor device according to an exemplary embodiment of the inventive concept.
Figure 2:
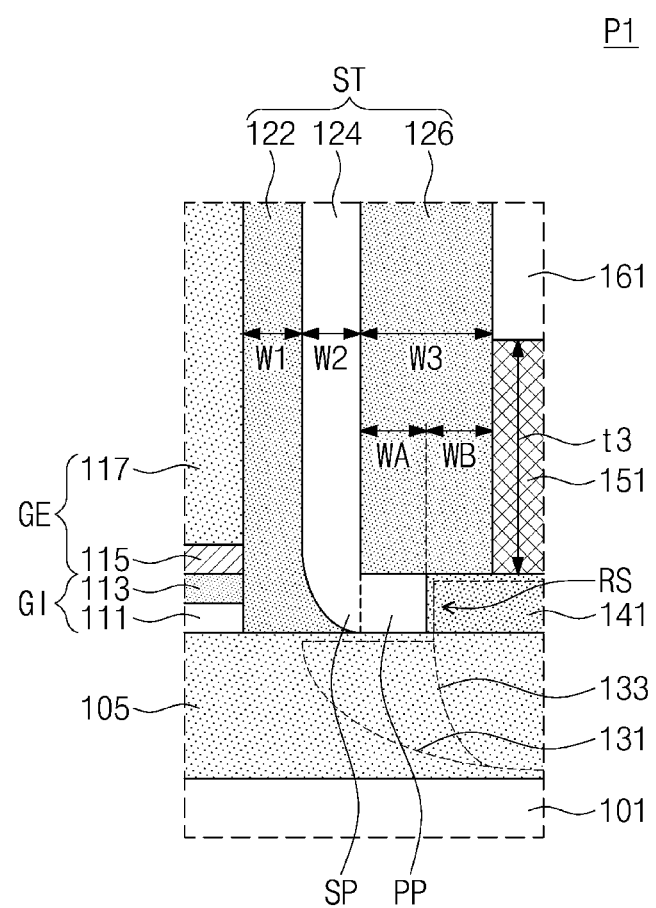
FIGS. 2 and 3 are enlarged views illustrating a portion 'P1' of FIG. 1.
Figure 3:
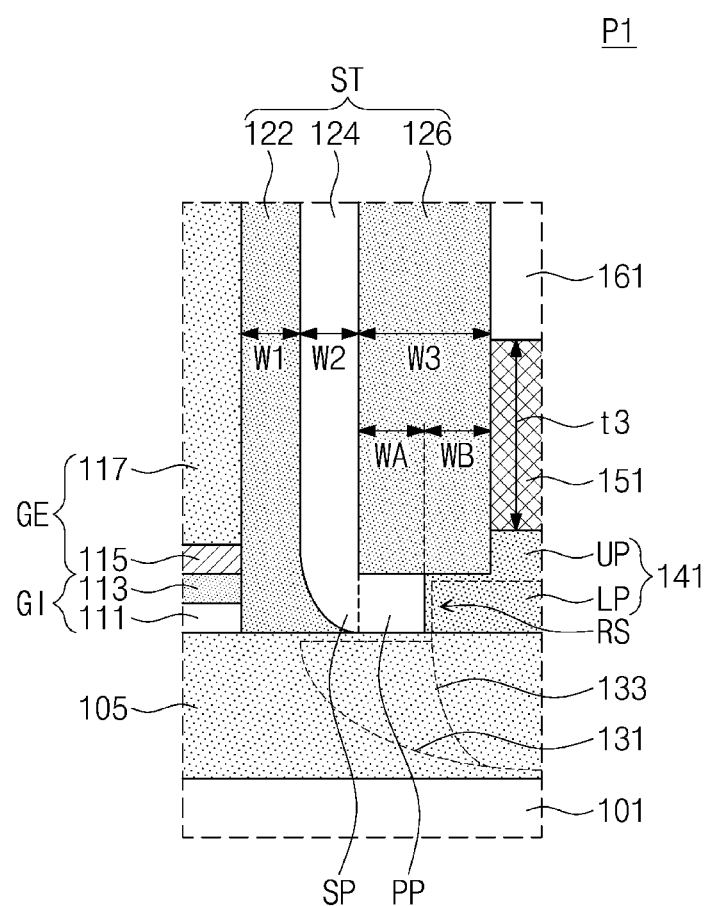

FIG. 1 is a cross-sectional view illustrating a semiconductor device according to an exemplary embodiment of the present inventive concept. FIGS. 2 and 3 are enlarged views of a portion 'P1' of FIG. 1.

Referring to FIGS. 1 to 3, first transistor TR1 may be provided on a substrate 10. The substrate 10 may be a silicon-on-insulator (SOI) substrate. As an example, the substrate 10 may be a fully-depleted SOI (FD-SOI) wafer. The substrate 10 may include a lower semiconductor layer 100, an insulating gapfill layer 101, and an upper semiconductor layer 105. As an example, the lower semiconductor layer 100 and the upper semiconductor layer 105 may each be silicon layers. The insulating gapfill layer 101 may be formed of or may otherwise include silicon oxide. A thickness t2 of the upper semiconductor layer 105 may be smaller than a thickness t1 of the insulating gapfill layer 101. As an example, the thickness t1 of the insulating gapfill layer 101 may be larger than or equal to two times the thickness t2 of the upper semiconductor layer 105. The upper semiconductor layer 105 may be in an undoped or intrinsic state, but in certain embodiments, may include n- or p-type impurities.

The first transistor TR1 may include a gate structure provided on the upper semiconductor layer 105. The gate structure may include a gate insulating layer GI and a gate electrode GE disposed on the gate insulating layer GI. The gate insulating layer GI may include a lower gate insulating layer 11*l* and an upper gate insulating layer 113. The lower gate insulating layer 111 may be formed of or may otherwise include, for example, silicon oxide. The upper gate insulating layer 113 may be formed of or may otherwise include, for example, a high-k dielectric materials (e.g., hafnium oxide), whose dielectric constant is higher than that of silicon oxide. The upper gate insulating layer 113 may be thicker than the lower gate insulating layer 111.

The gate electrode GE may include a metal gate electrode layer 115 and a semiconductor gate electrode layer 117. The metal gate electrode layer 115 may include a conductive metal nitride layer, such as, a titanium nitride layer, a tantalum nitride layer, and/or a tungsten nitride layer. The semiconductor gate electrode layer 117 may be formed of or may otherwise include poly silicon. The semiconductor gate electrode layer 117 may include n- or p-type impurities. The semiconductor gate electrode layer 117 may be thicker than the metal gate electrode layer 115. As an example, the semiconductor gate electrode layer 117 may be about 5 to about 10 times thicker than the metal gate electrode layer 115. A contact electrode 153 may be provided on the semiconductor gate electrode layer 117. The contact electrode 153 may be formed of or may otherwise include at least one metal-semiconductor compound. As an example, the contact electrode 153 may be formed of or may otherwise include at least one metal silicide materials, such as titanium silicide and/or nickel silicide.

A spacer structure ST may be provided on a sidewall of the gate electrode GE. The spacer structure ST may include a first spacer pattern 122, a second spacer pattern 124, and a third spacer pattern 126, which are sequentially stacked on the sidewall of the gate electrode GE. A thickness W3 of the third spacer pattern 126 may be larger than a thickness W1 of the first spacer pattern 122 and/or a thickness W2 of the second spacer pattern 124. As an example, the thickness W3 of the third spacer pattern 126 may be about 5 to about 10 times the thickness W2 of the second spacer pattern 124. The thickness W of the first spacer pattern 122 may be larger than the thickness W2 of the second spacer pattern 124.

The second spacer pattern 124 may include a material having an etch selectivity with respect to the first spacer pattern 122 and the third spacer pattern 126. As an example, the second spacer pattern 124 may be formed of or may otherwise include silicon oxide, and the first spacer pattern 122 and the third spacer pattern 126 may be formed of or may otherwise include silicon nitride. The first spacer pattern 122 may be formed of or may otherwise include the same material as the third spacer pattern 126. Since the second spacer pattern 124 is provided between the first spacer pattern 122 and the third spacer pattern 126, charge trapping in the spacer structure ST may be alleviated.

The second spacer pattern 124 may include a sidewall portion SP, which is extended primarily in a first direction D1 that is perpendicular to a top surface of the substrate 10, and a protruding portion PP, which is extended from the sidewall portion SP primarily in a second direction D2 that is perpendicular to the first direction D1. The sidewall portion SP may be extended into a region between the first spacer pattern 122 and the third spacer pattern 126. The protruding portion PP may be placed below a bottom surface of the third spacer pattern 126. The second spacer pattern 124 may have a substantially letter "L"-shaped section. A recess regions RS, which is recessed toward the gate electrode GE, may be provided below the spacer structure ST. Each of the recess regions RS may be defined by the bottom surface of the third spacer pattern 126 and a sidewall of the protruding portion PP. As an example, the protruding portion PP may cover just a portion of the bottom surface of the third spacer pattern 126.

The first transistor TR1 may include source/drain electrodes 151 provided on the sidewall of the spacer structure ST. The source/drain electrodes 151 may be formed of or may otherwise include at least one metal-semiconductor compound. As an example, the source/drain electrodes 151 may be formed of or may otherwise include at least one metal silicide material, such as titanium silicide and/or nickel silicide. Bottom surfaces of the source/drain electrodes 151 may be positioned at a level higher than or equal to the bottom surface of the third spacer pattern 126.

As used herein, the phrase "source/drain" is intended to signify the source and/or the drain. To some extent, these elements may be interchangeable in the structures described herein and so it is to be understood that for an element, such as a transistor, there may be two source/drains with one being a source and the other being a drain, but it might not be significant to the structure which one is a source and which one is a drain and so each may be referred to herein as a "source/drain."

The thickness t2 of the upper semiconductor layer 105 may be smaller than a thickness t3 of the source/drain electrodes 151. As an example, the thickness t2 of the upper semiconductor layer 105 may be equal to or smaller than half the thickness t3 of the source/drain electrodes 151.

First semiconductor patterns 141 may be provided between the source/drain electrodes 151 and the upper semiconductor layer 105. The first semiconductor patterns 141 may be an epitaxial layer, which is grown from a top surface of the upper semiconductor layer 105 by an epitaxial process. As an example, the upper semiconductor layer 105 may include a silicon layer, a silicon-germanium layer, and/or a silicon-carbide layer.

A thickness of the first semiconductor patterns 141 may be smaller than the thickness t3 of the source/drain electrodes 151. As an example, the thickness of the first semiconductor patterns 141 may be smaller than or equal to half the thickness t3 of the source/drain electrodes 151. The thickness of the first semiconductor patterns 141 may be smaller than the thickness t1 of the upper semiconductor layer 105.

The first semiconductor patterns 141 may be extended into the recess regions RS. A sum of a length WA and a length WB may be equal to the thickness W3 of the third spacer pattern 126, where the length WA is a length of the protruding portion PP of the second spacer pattern 124 extended into a region below the third spacer pattern 126, and the length WB may be a length of a portion of the first semiconductor patterns 141 extended into the recess region RS. A top surface of the first semiconductor patterns 141 may be positioned at a level equal to or higher than the bottom surface of the third spacer pattern 126. As an example, the top surface of the first semiconductor patterns 141 may be positioned at substantially the same level as the bottom surface of the third spacer pattern 126, as shown in FIG. 2. As an example, the top surface of the first semiconductor patterns 141 may be positioned at a level higher than the bottom surface of the third spacer pattern 126, as shown in FIG. 3. In this case, each of the first semiconductor patterns 141 may include a lower portion LP, which is lower than the bottom surface of the third spacer pattern 126, and an upper portion UP, which is higher than the bottom surface of the third spacer pattern 126. The lower portion LP may be inserted into the recess region RS to be in contact with the second spacer pattern 124. The upper portion UP may be connected to the sidewall of the third spacer pattern 126. For example, each of the first semiconductor patterns 141 may have a stepwise structure, in a connection region where it is connected to the third spacer pattern 126.

Source/drain regions 133 may each be provided in both the upper semiconductor layer 105 and the first semiconductor patterns 141. The source/drain regions 133 may be doped with p- or n-type dopants, depending on the kind of the first transistor TR1. The source/drain regions 133 may be extended to a bottom surface of the upper semiconductor layer 105. For example, the source/drain regions 133 may have a depth that is large enough to reach a top surface of the insulating gapfill layer 101. The source/drain regions 133 may be extended into a region below the third spacer pattern 126.

Lightly doped regions 131 may be provided in the upper semiconductor layer 105. The lightly doped regions 131 may be impurity regions having a lower doping concentration than the source/drain regions 133. The lightly doped regions 131 may have the same conductivity type as the source/drain regions 133. The lightly doped regions 131 may be regions, which are extended from the source/drain regions 133 toward the gate electrode GE.

A stress layer 161 may at least partially cover the gate structure. The stress layer 161 may exert tensile or compressive stress on the gate structure. As an example, the stress layer 161 may be formed of or may otherwise include silicon nitride. An interlayered insulating layer 171 may at least partially cover the stress layer 161. The interlayered insulating layer 171 may be formed of or may otherwise include silicon oxide.

First contacts 181 may penetrate the interlayered insulating layer 171 and may be connected to the source/drain electrodes 151. Lower portions of the first contacts 181 may be provided in upper portions of the source/drain electrodes 151. First conductive patterns 186 may be provided on the interlayered insulating layer 171 and may be connected to the first contacts 181. In an exemplary embodiment of the present inventive concept, the first contacts 181 and the first conductive patterns 186 may be formed of or may otherwise include at least one metal (e.g., copper, aluminum, tungsten, titanium, and/or tantalum) and/or metal nitrides thereof.

According to an exemplary embodiment of the present inventive concept, the first transistor TR1 may be provided on the upper semiconductor layer 105 having a relatively small thickness. Thus, when the first transistor TR1 is operated, a channel between the source/drain regions 133 may be formed throughout the entire region between the source/drain regions 133. For example, the region between the source/drain regions 133 may be fully depleted.

A distance between the first semiconductor patterns 141 and the gate electrode GE may determine a distance between the source/drain regions 133 and thus may also determine a channel length of the first transistor TR1. In the case where the distance between the first semiconductor patterns 141 and the gate electrode GE is excessively small, a leakage current may be increased. By contrast, in the case where the distance between the first semiconductor patterns 141 and the gate electrode GE is excessively large, a length of a current path may be increased, and in this case, performance of the transistor may be deteriorated.

In the first transistor TR1, according to an exemplary embodiment of the present inventive concept, the distance between the first semiconductor patterns 141 and the gate electrode GE may be determined by a length of the protruding portion PP of the second spacer pattern 124. For example, by adjusting the length of the protruding portion PP of the second spacer pattern 124, a transistor may be fabricated to have desired electric characteristics (e.g., a low leakage current).

Figure 4:
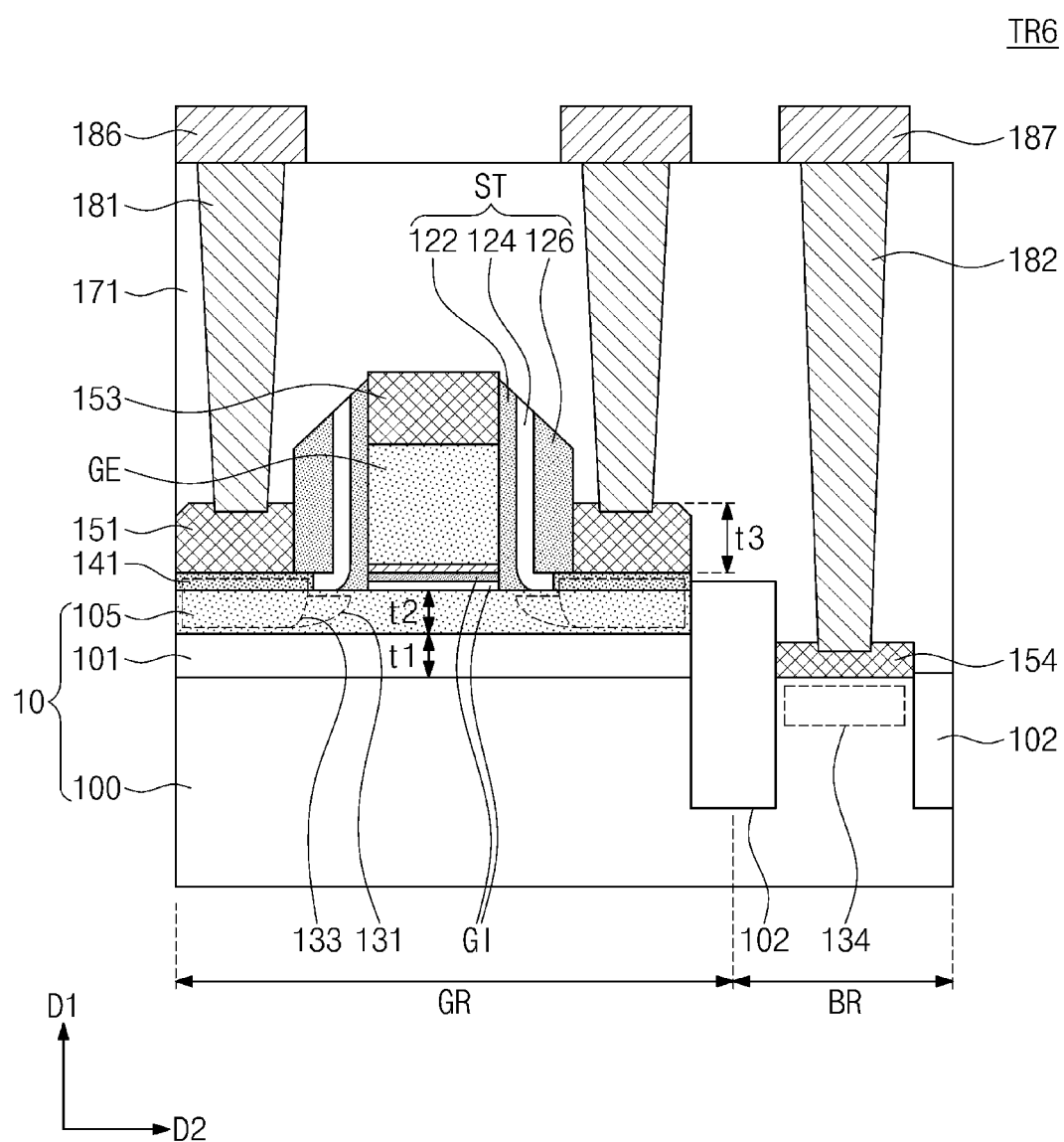
FIG. 4 is a cross-sectional view illustrating a semiconductor device according to an exemplary embodiment of the present inventive concept.

FIG. 4 is a cross-sectional view illustrating a semiconductor device according to an exemplary embodiment of the present inventive concept. For concise description, a previously described element may be identified by the same reference number without repeating an overlapping description thereof. Thus, to the extent that a detailed description for a particular element has been omitted, it may be assumed that the particular element is at least similar to corresponding elements that are described in detail elsewhere within the present disclosure.

Referring to FIG. 4, a sixth transistor TR6 may be provided on a substrate 10. The substrate 10 may include a lower semiconductor layer 100, an insulating gapfill layer 101, and an upper semiconductor layer 105. The sixth transistor TR6 may include source/drain electrodes 151 provided on a sidewall of a spacer structure ST. A thickness t1 of the insulating gapfill layer 101 may be smaller than a thickness t3 of the source/drain electrodes 151. As an example, the thickness t1 of the insulating gapfill layer 101 may be substantially equal to or smaller than the thickness t2 of the upper semiconductor layer 105.

In an exemplary embodiment of the present inventive concept, the semiconductor device may include a gate region GR and a back-side bias region BR, which are spaced apart from each other with an insulating isolation pattern 102 interposed therebetween. The insulating isolation pattern 102 may be formed of or may otherwise include silicon oxide. A gate structure may be provided on the gate region GR. The back-side bias region BR may be used to adjust a threshold voltage of the sixth transistor TR6 and may be configured to allow a back-side bias to be applied to the lower semiconductor layer 100 below the insulating gapfill layer 101. The insulating gapfill layer 101 may be provided to have a relatively small thickness, and in this case, the back-side biasing may be more easily performed.

The back-side bias region BR may include a pick-up impurity region 134, which is provided in an upper portion of the lower semiconductor layer 100, and a pick-up electrode 154, which is provided on the pick-up impurity region 134. The pick-up impurity region 134 may have a conductivity type different from the source/drain region 133. The pick-up electrode 154 may be formed of or may otherwise include at least one metal silicide material, such as titanium silicide and/or nickel silicide. The insulating gapfill layer 101 and the upper semiconductor layer 105 might not be provided in the back-side bias region BR, unlike the gate region GR.

A second contact 182 may penetrate the interlayered insulating layer 171 and may be connected to the pick-up electrode 154. A second conductive pattern 187 may be provided on the interlayered insulating layer 171 and may be connected to the second contact 182. As an example, the second contact 182 and the second conductive patterns 187 may be formed of or may otherwise include at least one metal (e.g., copper, aluminum, tungsten, titanium, and/or tantalum) and/or metal nitrides thereof.

Figure 5:
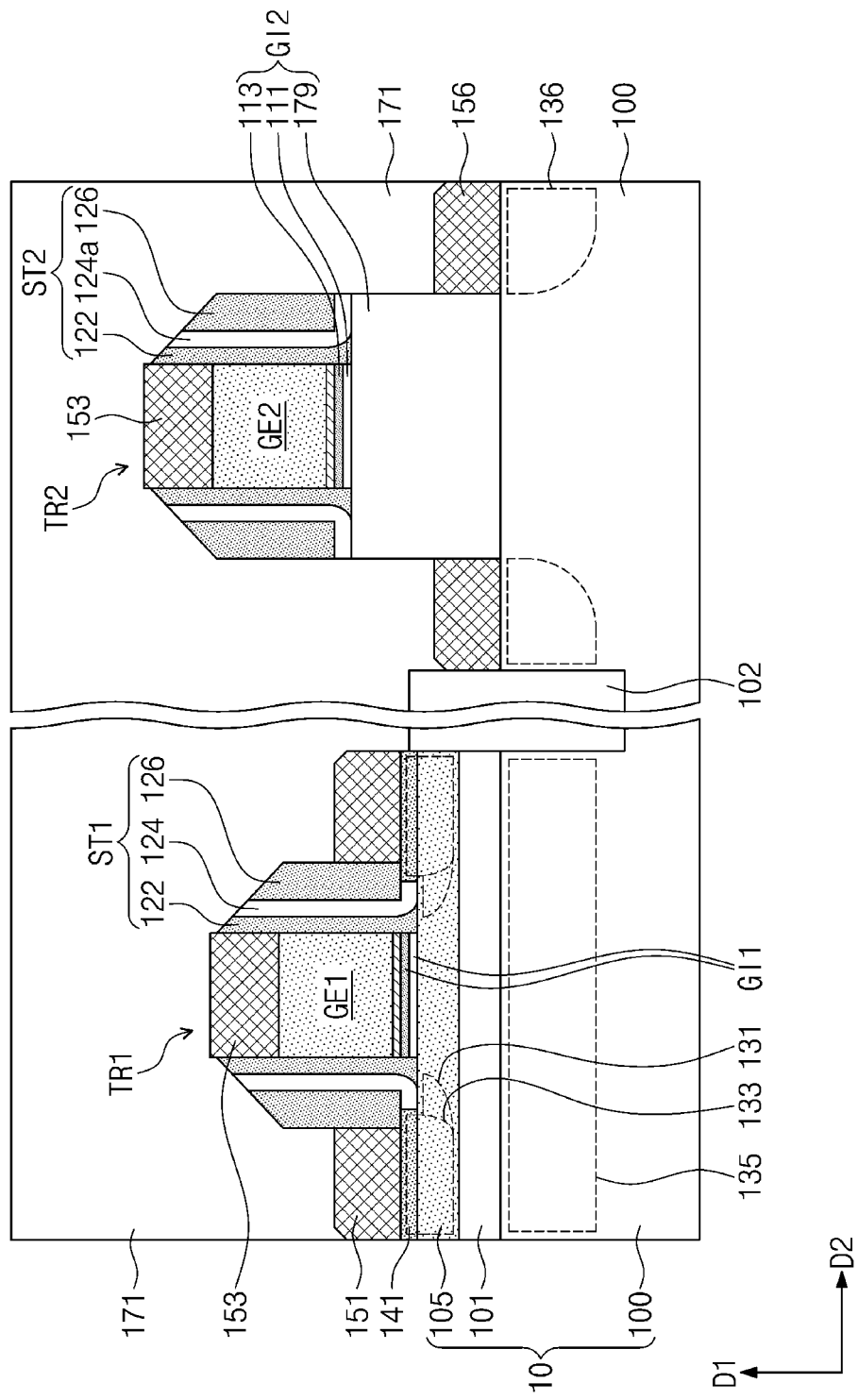
FIG. 5 is a cross-sectional view illustrating a semiconductor device according to an exemplary embodiment of the present inventive concept.

FIG. 5 is a cross-sectional view illustrating a semiconductor device according to an exemplary embodiment of the present inventive concept.

Referring to FIG. 5, a semiconductor device, according to an exemplary embodiment of the present inventive concept, may include a first transistor TR1 and a second transistor TR2. The first transistor TR1 and the second transistor TR2 may be spaced apart from each other with an insulating isolation pattern 102 interposed therebetween.

The first transistor TR1 may include a first gate electrode GE1, a first gate insulating layer GI1, and a first spacer structure ST1. The second transistor TR2 may include a second gate electrode GE2, a second gate insulating layer GI2, and a second spacer structure ST2. As an example, the first transistor TR1 may be a logic transistor including a logic circuit, and the second transistor TR2 may be a transistor, which is used as a part of an analog device and is configured to use a higher voltage than that of the first transistor TR1.

The first transistor TR1 may include a first lower impurity region 135, which is provided in an upper portion of the lower semiconductor layer 100 adjacent to the insulating gapfill layer 101. The first lower impurity region 135 may be disposed below the first gate electrode GE1 and the first source/drain regions 133. The first lower impurity region 135 may be formed by an ion implantation process, which is performed before forming the first gate electrode GE1 and the first gate insulating layer GI1. In the case where the first transistor TR1 is an NMOS transistor, the first lower impurity region 135 may be an n-type impurity region. In some exemplary embodiments of the present inventive concept, in the case where the first transistor TR1 is an NMOS transistor, the first lower impurity region 135 may be a p-type impurity region. In the case where the first lower impurity region 135 has a same conductivity type as the source/drain region 133, the first transistor TR1 may have a low threshold voltage, compared with the case in which the first lower impurity region 135 has a conductivity type different from that of the source/drain region 133. A bottom surface of the insulating isolation pattern 102 may be located at a level lower than a bottom surface of the first lower impurity region 135.

The second transistor TR2 may be formed on a region of the lower semiconductor layer 100, from which the insulating gapfill layer 101 and the upper semiconductor layer 105 are removed. For example, the first source/drain regions 133 of the first transistor TR1 may be provided in the first semiconductor pattern 141 and the upper semiconductor layer 105, whereas second source/drain regions 136 of the second transistor TR2 may be provided in an upper portion of the lower semiconductor layer 100. Second source/drain electrodes 156 may be provided on the second source/drain regions 136. The second source/drain electrodes 156 may be formed by performing a silicide process on an upper portion of the lower semiconductor layer 100. The second source/drain electrodes 156 may be formed of or may otherwise include, for example, at least one metal silicide material, such as titanium silicide and/or nickel silicide.

A second gate insulating layer GI2 of the second transistor TR2 may include a gate insulating portion 179. The second gate insulating layer GI2 may include a lower gate insulating layer 11, and/or an upper gate insulating layer 113, which are provided on the gate insulating portion 179. However, in an exemplary embodiment of the present inventive concept, the lower gate insulating layer 111 and the upper gate insulating layer 113 might be omitted. As an example, the lower gate insulating layer 111 may be formed of or may otherwise include silicon oxide. As an example, the upper gate insulating layer 113 may be formed of or may otherwise include at least one high-k dielectric material, such as hafnium oxide.

The gate insulating portion 179 may be thicker than the lower gate insulating layer 111 and the upper gate insulating layer 113. As an example, the gate insulating portion 179 may be thicker than the second gate electrode GE2. As an example, the gate insulating portion 179 may be thicker than the insulating gapfill layer 101 below the first transistor TR1. The gate insulating portion 179 may be formed of or may otherwise include silicon oxide.

The second spacer structure ST2 might not include the recess region, unlike the first spacer structure ST1. As an example, a second spacer pattern 124a of the second spacer structure ST2 might not be recessed toward the second gate electrode GE2, unlike the second spacer pattern 124 of the first spacer structure ST1. As an example, the sidewall of the second spacer pattern 124 may be aligned to the sidewall of the gate insulating portion 179.

Figure 6:
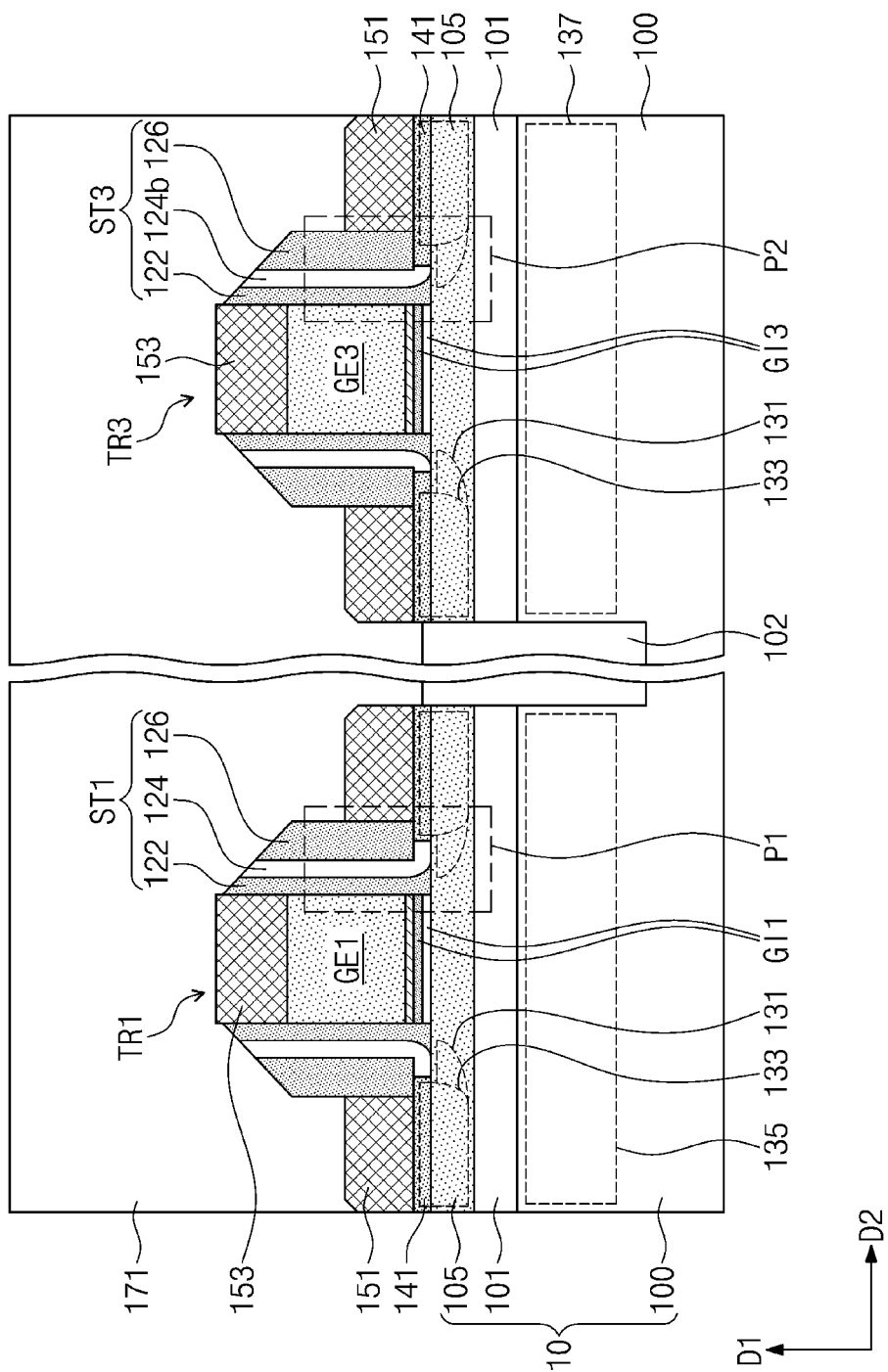
FIG. 6 is a cross-sectional view illustrating a semiconductor device according to an exemplary embodiment of the present inventive concept.
Figure 7:
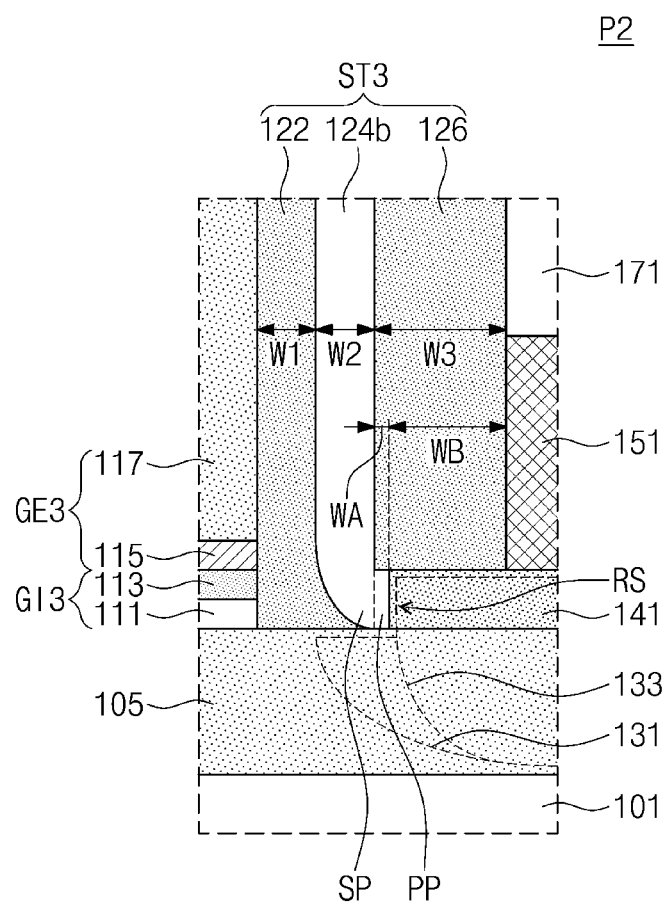
FIG. 7 is an enlarged view of a portion 'P2' of FIG. 6.

FIG. 6 is a cross-sectional view illustrating a semiconductor device according to an exemplary embodiment of the present inventive concept. FIG. 7 is an enlarged view of a portion 'P2' of FIG. 6.

Referring to FIGS. 6 and 7, a semiconductor device, according to an exemplary embodiment of the present inventive concept, may include a first transistor TR1 and a third transistor TR3. The first transistor TR1 may include a first gate electrode GE1, a first gate insulating layer GI1, and a first spacer structure ST1. The third transistor TR3 may include a third gate electrode GE3, a third gate insulating layer GI3, and a third spacer structure ST3. As an example, the first transistor TR1 and the third transistor TR3 may be of a same conductivity type. The first transistor TR1 may be configured to have substantially the same features as the first transistor TR1 described herein with reference to FIG. 5. A portion 'P1' in FIG. 6 may correspond to a portion 'P1' in FIG. 2.

Except for a shape of a second spacer pattern 124b, the third transistor TR3 may have the same structure as the first transistor TR1. Hereinafter, the second spacer pattern 124b will be described based on comparison with the portion 'P1' of FIG. 2.

As shown in FIG. 7, the second spacer pattern 124b of the third transistor TR3 may include a protruding portion PP, which is shorter than that in the second spacer pattern 124 of the first transistor TR1. For example, a length WA of the protruding portion PP of the second spacer pattern 124b may be shorter than that of the first transistor TR1. A length WB of first semiconductor patterns 141 extended into the recess region RS may be longer than that of the first transistor TR1. Thus, the third transistor TR3 may have a channel length shorter than that of the first transistor TR1, and a threshold voltage of the third transistor TR3 may be lower than that of the first transistor TR1.

The first transistor TR1 may include a first lower impurity region 135, which is provided in an upper portion of the lower semiconductor layer 100 adjacent to the insulating gapfill layer 101. The third transistor TR3 may include a second lower impurity region 137, which is provided in an upper portion of the lower semiconductor layer 100 adjacent to the insulating gapfill layer 101. In the case where the first transistor TR1 and the third transistor TR3 are of the same conductivity type, the second lower impurity region 137 may be an impurity region, which is of a conductivity type different from the first lower impurity region 135. For example, in the case where the first transistor TR1 and the third transistor TR3 are NMOS transistors, the first lower impurity region 135 may be an n-type impurity region and the second lower impurity region 137 may be a p-type impurity region. In this case, the first transistor TR1 may have a threshold voltage that is lower than a threshold voltage of the third transistor TR3.

Figure 8:
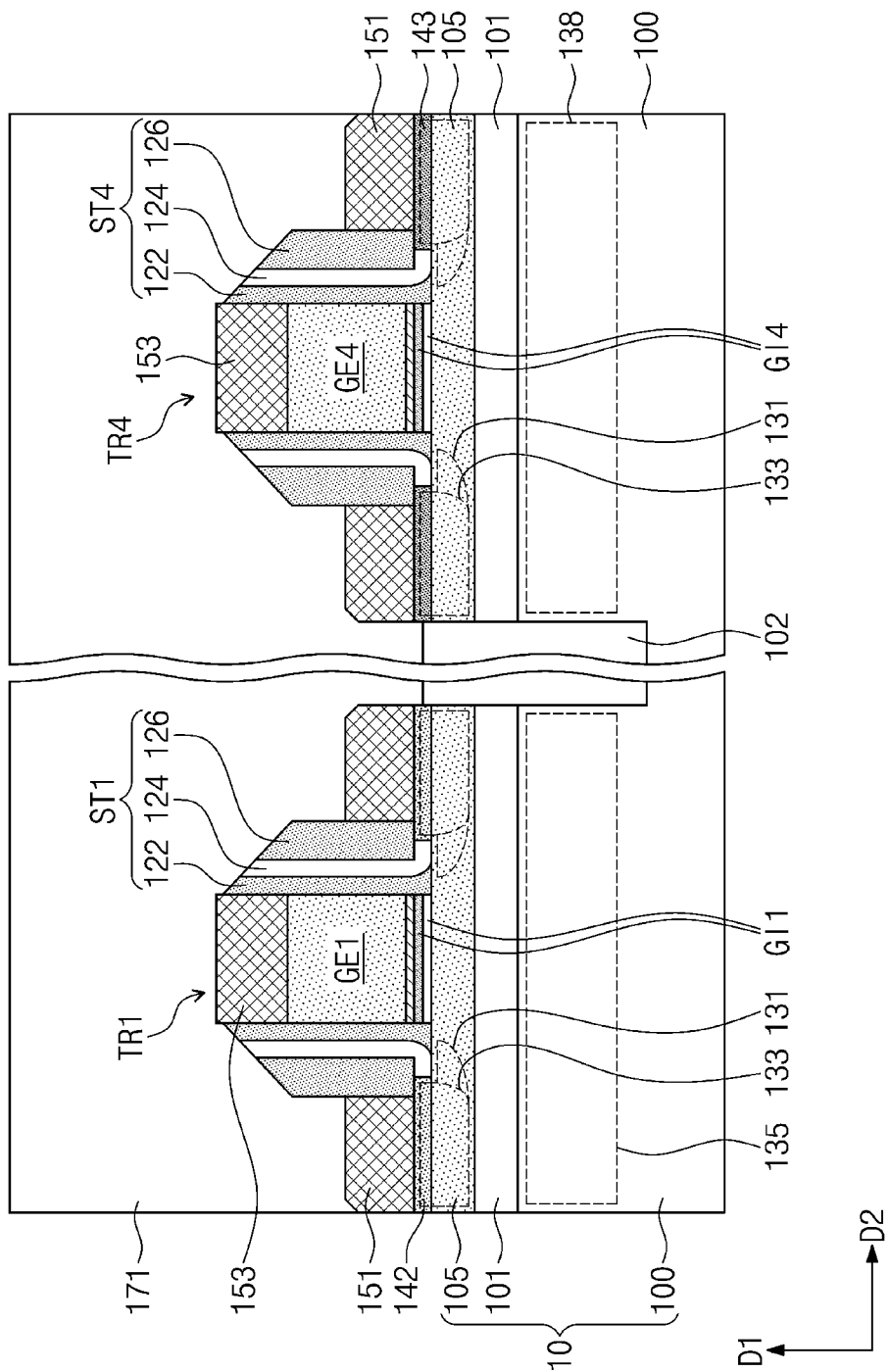
FIG. 8 is a cross-sectional view illustrating a semiconductor device according to an exemplary embodiment of the present inventive concept.

FIG. 8 is a cross-sectional view illustrating a semiconductor device according to an exemplary embodiment of the inventive concept.

Referring to FIG. 8, a semiconductor device, according to an exemplary embodiment of the present inventive concept, may include a first transistor TR1 and a fourth transistor TR4. The first transistor TR1 may include a first gate electrode GE1, a first gate insulating layer GI1, and a first spacer structure ST1. The fourth transistor TR4 may include a fourth gate electrode GE4, a fourth gate insulating layer GI4, and a fourth spacer structure ST4. The first transistor TR1 may have a conductivity type that is different from the fourth transistor TR4. As an example, the first transistor TR1 may be an NMOS transistor, and the fourth transistor TR4 may be a PMOS transistor.

The first transistor TR1 may include second semiconductor patterns 142 between source/drain electrodes 151 and upper semiconductor layer 105. The fourth transistor TR4 may include third semiconductor patterns 143 between source/drain electrodes 151 and upper semiconductor layer 105. The second semiconductor patterns 142 and/or the third semiconductor patterns 143 may include a material different from the upper semiconductor layer 105. As an example, the third semiconductor patterns 143 may be formed of a material capable of exerting a compressive strain on a channel region of the fourth transistor TR4. For example, the third semiconductor patterns 143 may include silicon germanium (SiGe). The second semiconductor patterns 142 may be formed of a material capable of exerting a tensile strain on a channel region of the first transistor TR1. For example, the second semiconductor patterns 142 may include silicon carbide (SiC).

The first transistor TR1 may include a first lower impurity region 135, which is provided in an upper portion of the lower semiconductor layer 100 adjacent to the insulating gapfill layer 101. The fourth transistor TR4 may include a third lower impurity region 138, which is provided in an upper portion of the lower semiconductor layer 100 adjacent to the insulating gapfill layer 101. The third lower impurity region 138 may be an impurity region, which is of a conductivity type that is different from the first lower impurity region 135. For example, in the case where the first transistor TR1 is an NMOS transistor and the fourth transistor TR4 is a PMOS transistor, the first lower impurity region 135 may be an n-type impurity region and the third lower impurity region 138 may be a p-type impurity region.

Figure 9:
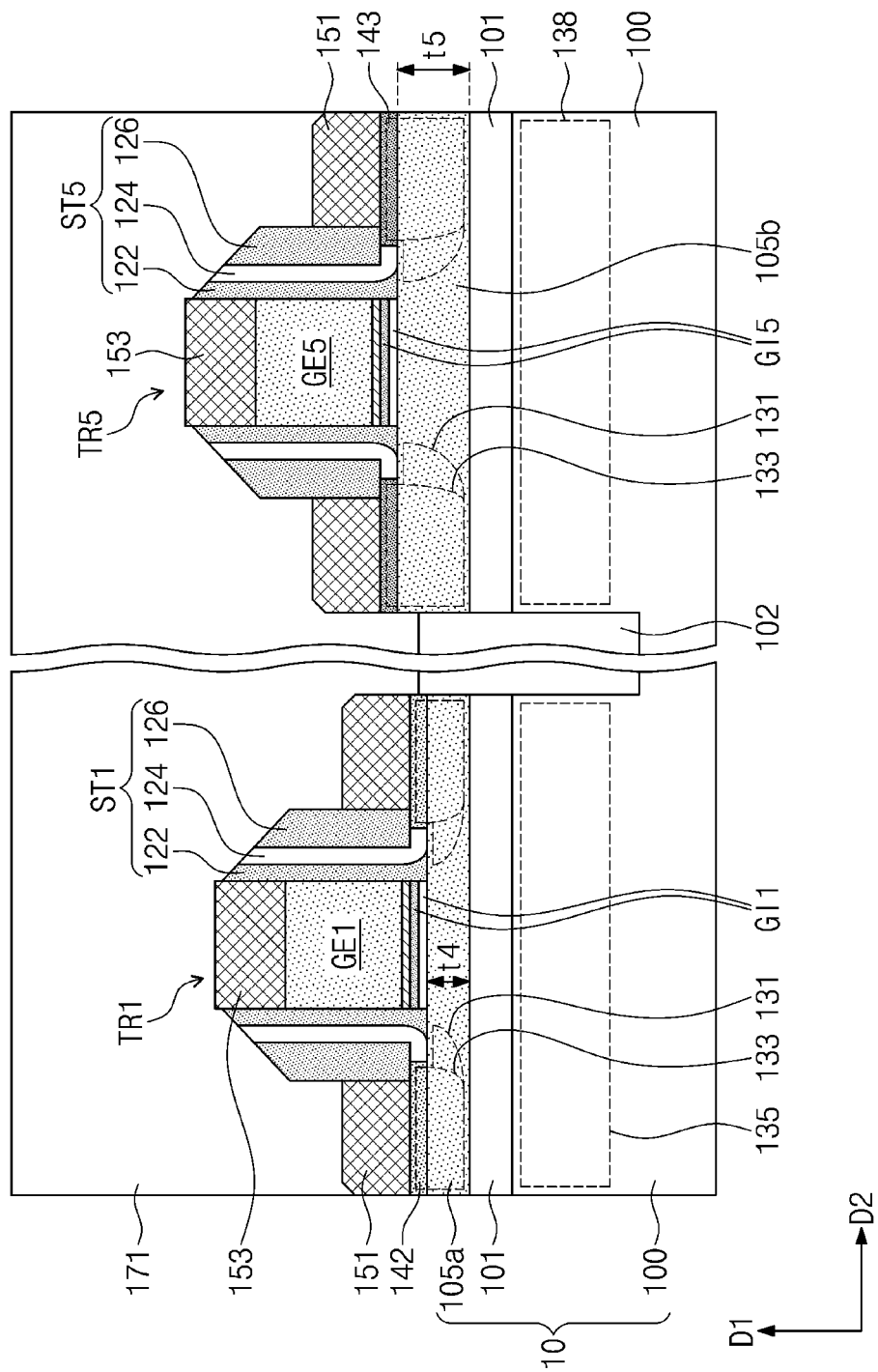
FIG. 9 is a cross-sectional view illustrating a semiconductor device according to an exemplary embodiment of the present inventive concept.

FIG. 9 is a cross-sectional view illustrating a semiconductor device according to an exemplary embodiment of the present inventive concept.

Referring to FIG. 9, a semiconductor device, according to an exemplary embodiment of the present inventive concept, may include a first transistor TR1 and a fifth transistor TR5. The first transistor TR1 may include a first gate electrode GE1, a first gate insulating layer GI1, and a first spacer structure ST1. The fifth transistor TR5 may include a fifth gate electrode GE5, a fifth gate insulating layer GI5, and a fifth spacer structure ST5. The first transistor TR1 may have a conductivity type that is different from the fifth transistor TR5. As an example, the first transistor TR1 may be an NMOS transistor, and the fifth transistor TR5 may be a PMOS transistor.

A thickness t5 of a second upper semiconductor layer 105b, on which the fifth transistor TR5 is provided, may be larger than a thickness t4 of a first upper semiconductor layer 105a, on which the first transistor TR1 is provided. As an example, both of the first upper semiconductor layer 105a and the second upper semiconductor layer 105b may be silicon layers. In certain embodiments, the first upper semiconductor layer 105a may be a silicon layer, and the second upper semiconductor layer 105b may further include a material (e.g., silicon-germanium), which is different from that of the first upper semiconductor layer 105a.

The second upper semiconductor layer 105b may be formed by a deposition process of forming an additional semiconductor material, such as silicon, on a region of the substrate 10, before the formation of the fifth gate electrode GE5 of the fifth transistor TR5. As an example, the deposition process may be an epitaxial process.

The first transistor TR1 may include second semiconductor patterns 142 disposed between the source/drain electrodes 151 and the first upper semiconductor layer 105a. The fifth transistor TR5 may include third semiconductor patterns 143 disposed between the source/drain electrodes 151 and the second upper semiconductor layer 105b. The third semiconductor patterns 143 may include, for example, silicon germanium (SiGe). The second semiconductor patterns 142 may include, for example, silicon carbide (SiC).

The first transistor TR1 may include a first lower impurity region 135, which is provided in an upper portion of the lower semiconductor layer 100. The fifth transistor TR5 may include a third lower impurity region 138, which is provided in an upper portion of the lower semiconductor layer 100. The third lower impurity region 138 may be an impurity region, which is of the same conductivity type as the first lower impurity region 135. For example, the first transistor TR1 is an NMOS transistor and the fifth transistor TR5 is a PMOS transistors, the first lower impurity region 135 and the third lower impurity region 138 may be p-type impurity regions.

Figure 10:
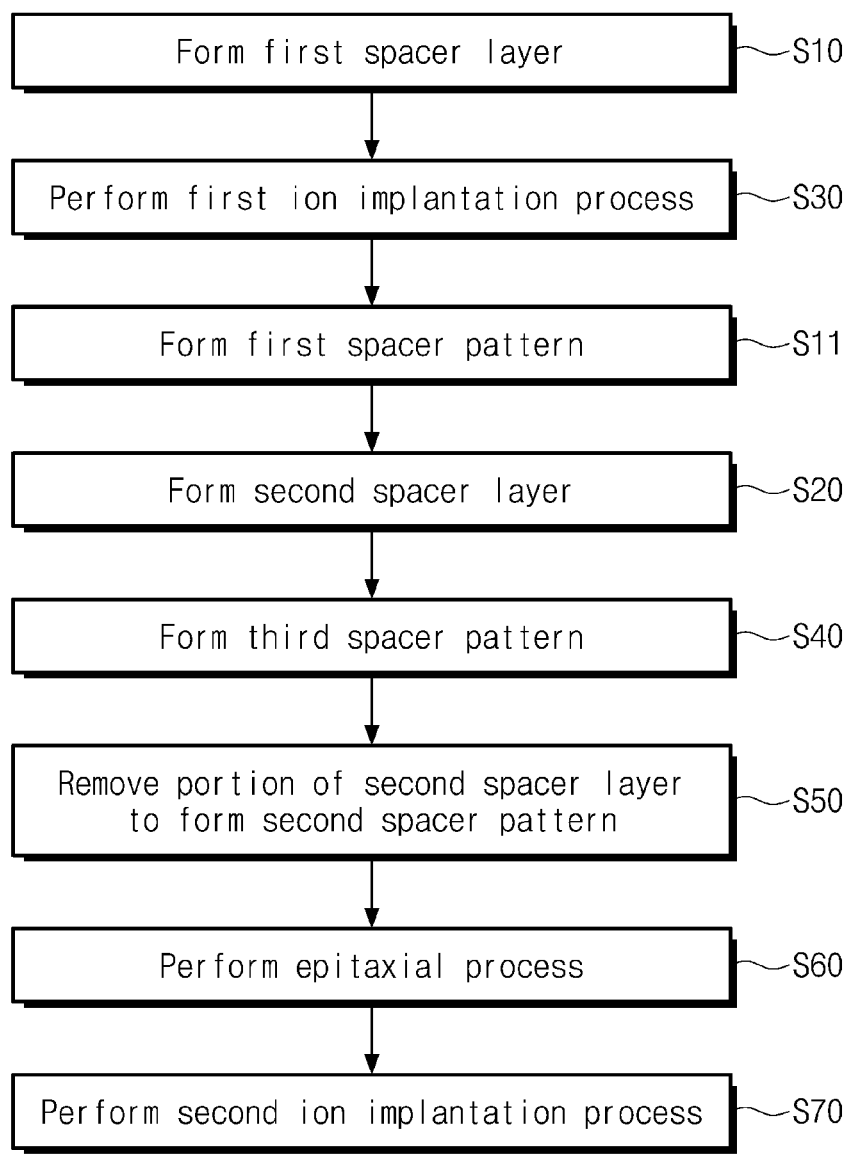
FIGS. 10 and 11 are flow charts illustrating a process of fabricating a semiconductor device according to an exemplary embodiment of the present inventive concept.
Figure 11:
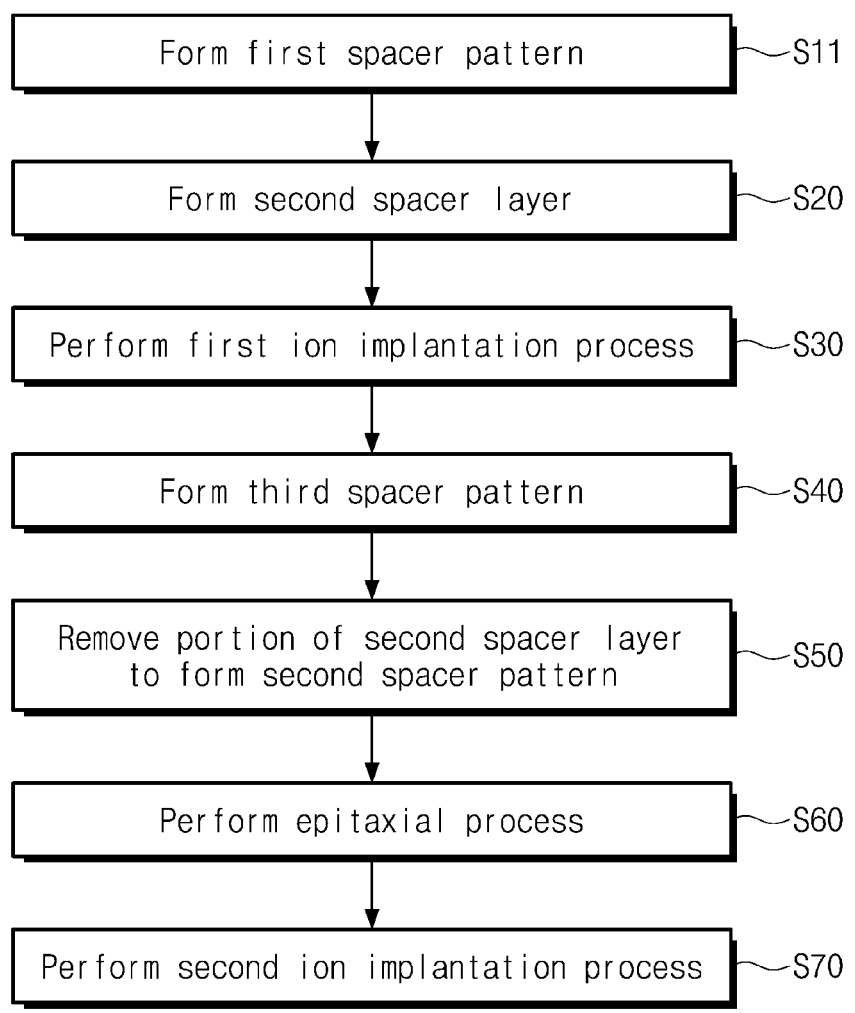

FIGS. 10 and 11 are flow charts illustrating a process of fabricating a semiconductor device according to an exemplary embodiment of the present inventive concept. FIGS. 12 to 18 are cross-sectional views illustrating a method of fabricating a semiconductor device according to an exemplary embodiment of the present inventive concept.

Figure 12:
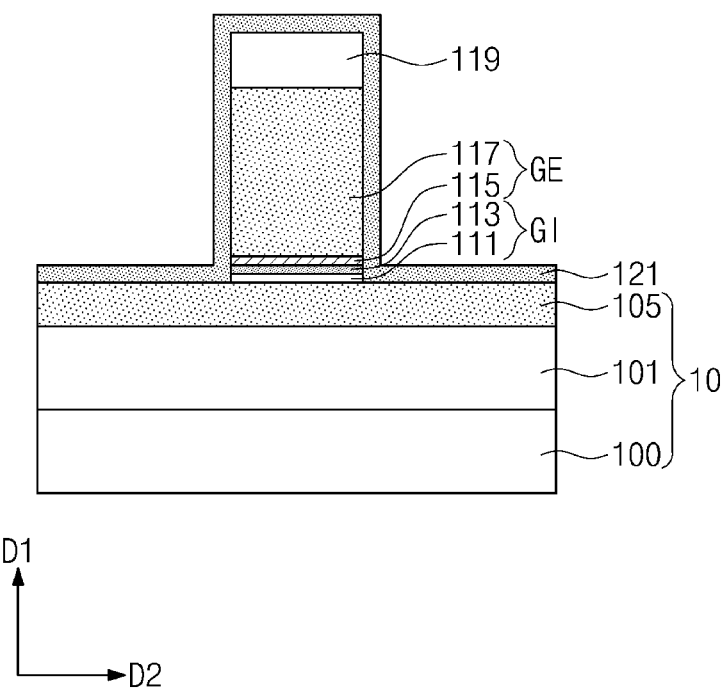
FIGS. 12 to 18 are cross-sectional views illustrating a method of fabricating a semiconductor device according to an exemplary embodiment of the present inventive concept.

Referring to FIG. 12, a gate structure may be formed on a substrate 10. The substrate 10 may be a silicon-on-insulator (SOI) substrate. As an example, the substrate 10 may be a fully-depleted SOI (FD-SOI) wafer. The substrate 10 may include a lower semiconductor layer 100, an insulating gapfill layer 101, and an upper semiconductor layer 105. The upper semiconductor layer 105 may be of an undoped or intrinsic state, but the inventive concept is not limited to this example.

The gate structure may include a gate insulating layer GI and a gate electrode GE sequentially stacked on the upper semiconductor layer 105. As an example, the formation of the gate structure may include sequentially forming a lower gate insulating layer 111, an upper gate insulating layer 113, a metal gate electrode layer 115, a semiconductor gate electrode layer 117, and a hard mask pattern 119 on the upper semiconductor layer 105 and then performing a patterning process using the hard mask pattern 119.

As an example, the lower gate insulating layer 111 may be formed of or may otherwise include silicon oxide. As an example, the upper gate insulating layer 113 may be formed of or may otherwise include at least one high-k dielectric material, such as hafnium oxide. The metal gate electrode layer 115 may be formed of or may otherwise include at least one conductive metal nitride, such as, titanium nitride, tantalum nitride, and/or tungsten nitride. The semiconductor gate electrode layer 117 may be formed of or may otherwise include poly silicon. The hard mask pattern 119 may be formed of or may otherwise include at least one silicon oxide, silicon nitride, and/or silicon oxynitride.

A first spacer layer 121 may cover the substrate 10 provided with the gate electrode GE (in step S10). As an example, the first spacer layer 121 may be formed of or may otherwise include silicon nitride. The first spacer layer 121 may be formed by a chemical vapor deposition process or an atomic layer deposition process.

Figure 13:
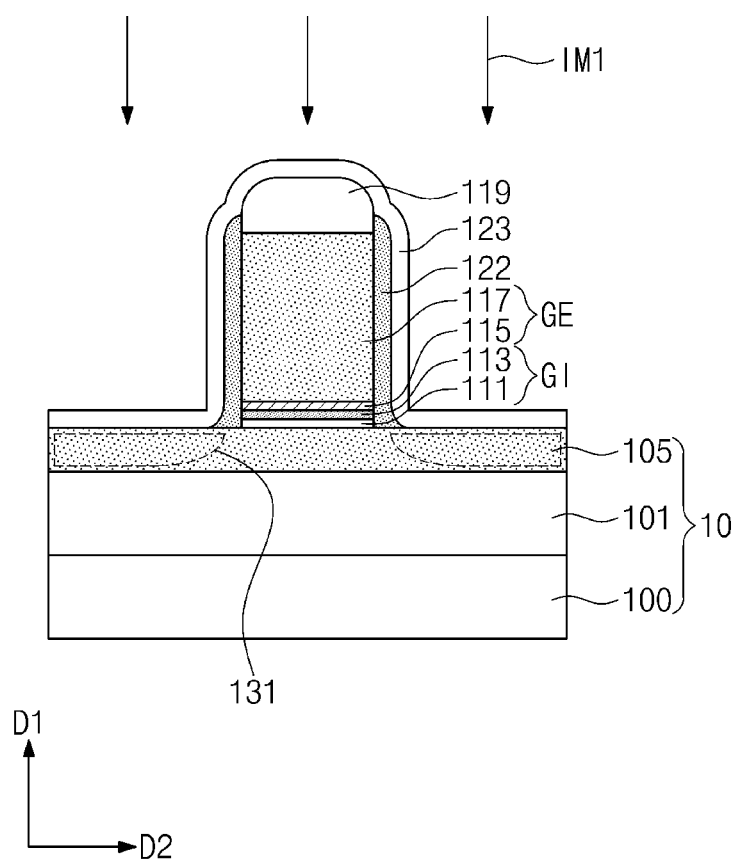

Referring to FIGS. 10, 11, and 13, a first ion implantation process IM1 may be performed (in step S30), after the formation of the first spacer layer 121. The first ion implantation process IM1 may be performed to form a lightly doped region 131 in the upper semiconductor layer 105. The lightly doped region 131 may be formed to have a depth that is large enough to allow it to be in contact with a bottom surface of the upper semiconductor layer 105. Conductivity types of impurities to be used in the first ion implantation process IM1, may be of an n- or p-type, depending on the kind of a transistor.

The first ion implantation process IM1 may be performed before forming third spacer patterns 126 to be described below. According to the approach illustrated in FIG. 10, if the first ion implantation process IM1 is finished, the first spacer layer 121 may be etched to form first spacer patterns 122, which are spaced apart from each other with the gate electrode GE interposed therebetween and expose the hard mask pattern 119 (in step S11). For example, the first ion implantation process IM1 may be performed before the formation of the first spacer patterns 122. After the formation of the first spacer patterns 122, a second spacer layer 123 may be formed (in step S20).

According to the approach illustrated in FIG. 11, the first ion implantation process IM1 may be performed (in step S30), after the etching of the first spacer layer 121 to form the first spacer patterns 122 (in step S11) and the forming of the second spacer layer 123 to the first spacer patterns 122 (in step S20). In this case, impurities in the first ion implantation process IM1 may remain in a portion of the second spacer layer 123.

The second spacer layer 123 may be formed of a material having an etch selectivity with respect to the first spacer patterns 122. For example, in the case where the first spacer layer 121 includes silicon nitride, the second spacer layer 123 may be formed of or may otherwise include silicon oxide. The second spacer layer 123 may be formed to conformally cover the first spacer patterns 122, the upper semiconductor layer 105, and the hard mask pattern 119. The formation of the second spacer layer 123 may be performed using a chemical vapor deposition process or an atomic layer deposition process.

Figure 14:
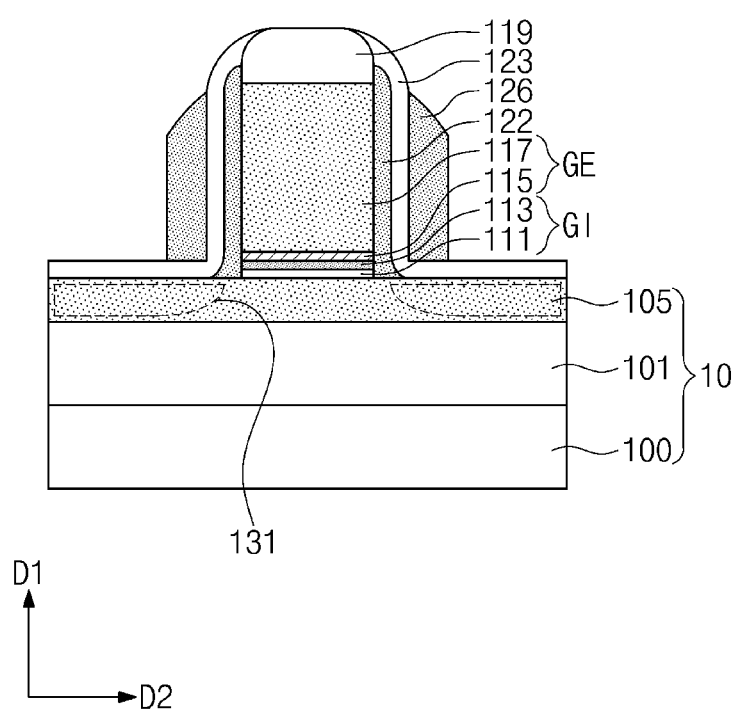

Referring to FIGS. 10, 11, and 14, third spacer patterns 126 may be formed on sidewalls of the second spacer layer 123 (in step S40). The third spacer patterns 126 may be formed by forming a third spacer layer to cover the second spacer layer 123 and performing an anisotropic etching process. The third spacer layer 126 may be formed thicker than either the first spacer layer 121 or the second spacer layer 123 and may also be formed of an equal thickness to or thicker than the first spacer layer 121 and the second spacer layer 123 combined. A portion of the second spacer layer 123, along with the third spacer layer, may be etched, during the anisotropic etching process. The second spacer layer 123 may prevent the upper semiconductor layer 105 from being damaged by the anisotropic etching process. The third spacer patterns 126 may be formed of or may otherwise include the same material as the first spacer patterns 122. As an example, the third spacer patterns 126 may be formed of or may otherwise include silicon nitride.

Figure 15:
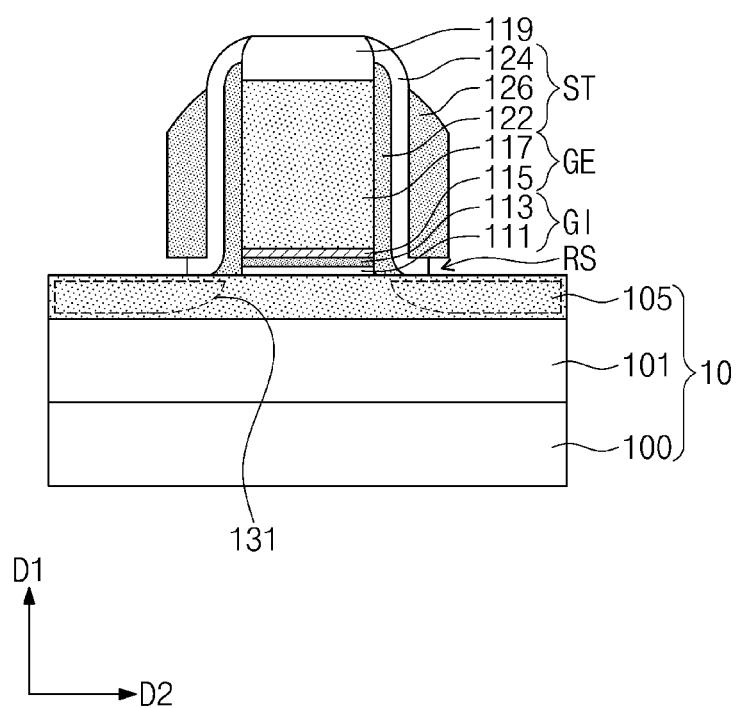

Referring to FIGS. 10, 11, and 15, a portion of the second spacer layer 123 may be removed to form second spacer patterns 124 (in step S50). Accordingly, recess regions RS may be formed to partially expose bottom surfaces of the third spacer patterns 126. The recess regions RS may be regions that are recessed from sidewalls of the third spacer patterns 126 toward the gate electrode GE. The recess regions RS may be formed by a selective etching process. For example, the recess regions RS may be formed by a process of etching the second spacer layer 123 while suppressing etchings of the first spacer patterns 122 and the third spacer patterns 126. As an example, the formation of the recess regions RS may be performed using a wet cleaning process. Hereinafter, a structure including the first spacer patterns 122, the second spacer patterns 124, and the third spacer patterns 126 will be referred to as a spacer structure ST.

Figure 16:
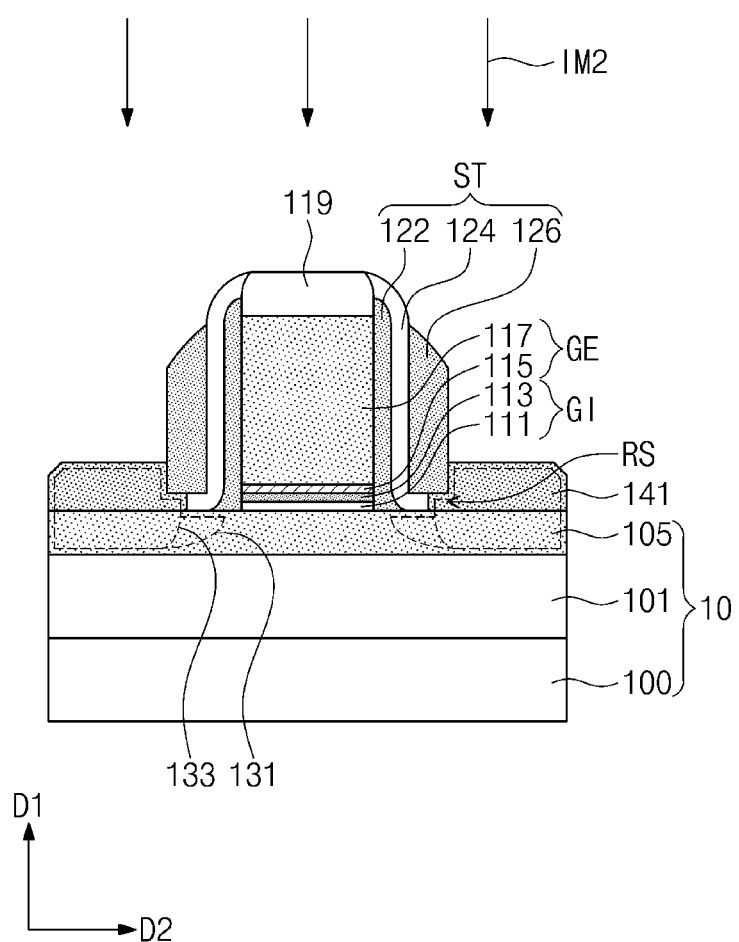

Referring to FIGS. 10, 11, and 16, first semiconductor patterns 141 may be grown from the upper semiconductor layer 105. The first semiconductor patterns 141 may be formed by a selective epitaxial process, which is performed on an exposed surface of the upper semiconductor layer 105 (in step S60). In an exemplary embodiment of the present inventive concept, a material of the first semiconductor patterns 141 may be changed depending on the kinds of the semiconductor patterns described with reference to FIGS. 1 to 9. The first semiconductor patterns 141 may fill the recess regions RS and may be grown along sidewalls of the third spacer patterns 126 or in the first direction D1. As an example, the first semiconductor patterns 141 may be formed to have a top surface that is located at a level higher than a top surface of the metal gate electrode layer 115.

The first semiconductor patterns 141 may be formed to have a stepwise structure, through a single epitaxial process. Thus, it may be possible to reduce a process variation and process complexity, compared with the case of forming the first semiconductor patterns 141 through multiple epitaxial processes. Since the first semiconductor patterns 141 are formed having a relatively small thickness, the upper semiconductor layer 105 may realize a desired thickness or a sufficient depth for source/drain electrodes and source/drain regions, which will be described below. In addition, it may be possible to reduce an etch damage of the first semiconductor patterns 141, which may occur in a process of forming a spacer pattern, compared with the case of forming the first semiconductor patterns 141 through multiple epitaxial processes.

A second ion implantation process IM2 may be performed on the first semiconductor patterns 141 and the upper semiconductor layer 105 (in step S70). The second ion implantation process IM2 may be performed using impurities, which are of the same type as that for the first ion implantation process IM1. The second ion implantation process IM2 may be performed under a dose condition that is higher than that for the first ion implantation process IM1. As a result, source/drain regions 133 may be formed in the first semiconductor patterns 141 and the upper semiconductor layer 105. The source/drain regions 133 may be formed to have a depth that is large enough to allow it to be in contact with the bottom surface of the upper semiconductor layer 105. For example, there may be no undoped or intrinsic region disposed between the source/drain regions 133 and the insulating gapfill layer 101. The source/drain regions 133 may be formed in portions of the first semiconductor patterns 141 filling the recess regions RS.

Figure 17:
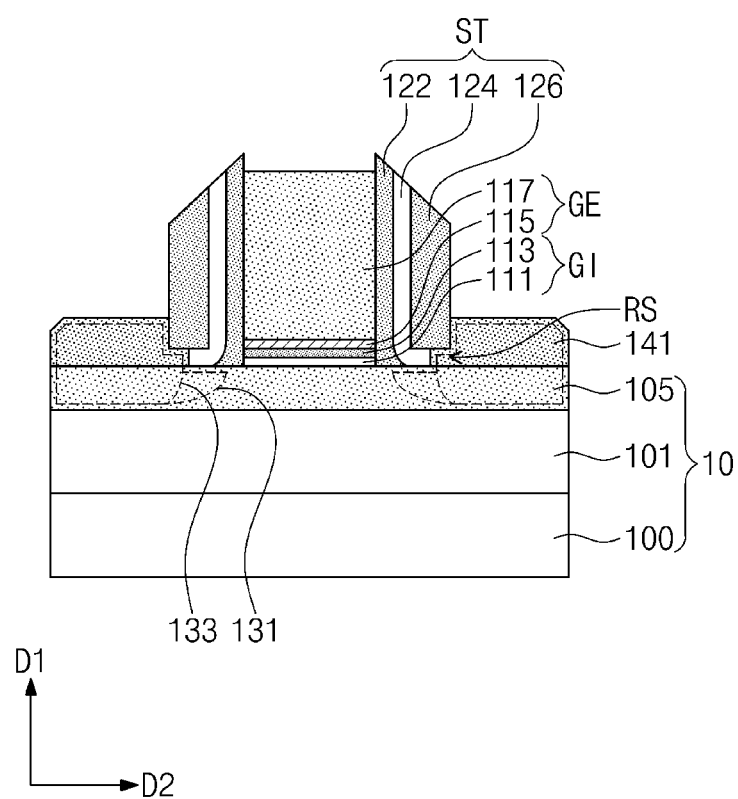

Referring to FIG. 17, the hard mask pattern 119 may be removed. The removal of the hard mask pattern 119 may be performed using a selective etching process. An upper portion of the second spacer patterns 124, along with the hard mask pattern 119, may be removed during the removal of the hard mask pattern 119. As a result of the removal of the hard mask pattern 119, a top surface of the semiconductor gate electrode layer 117 may be exposed.

Figure 18:
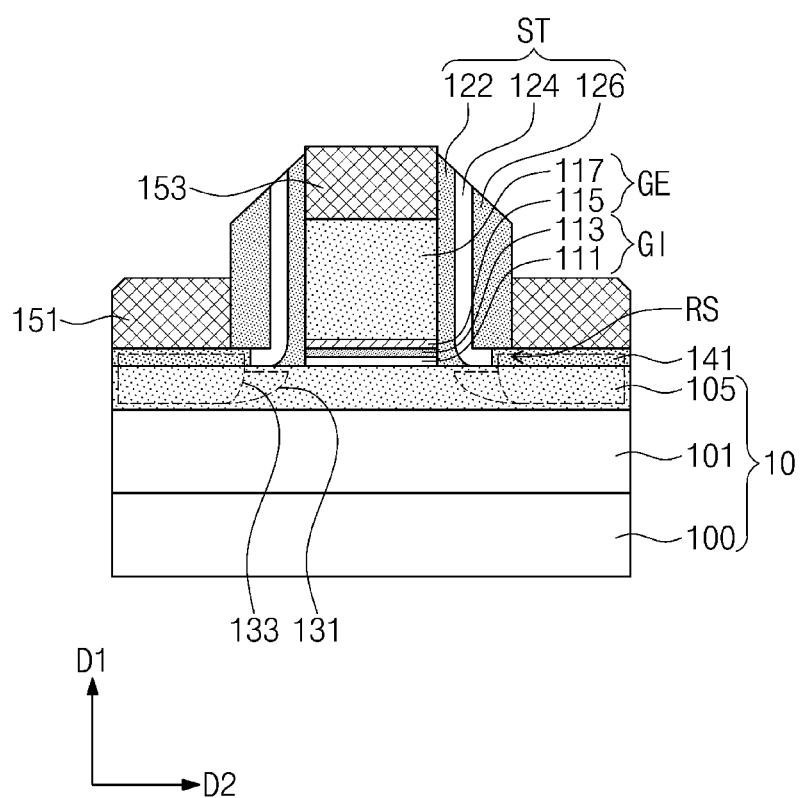

Referring to FIG. 18, source/drain electrodes 151 may be formed on the first semiconductor patterns 141. The source/drain electrodes 151 may be formed of or may otherwise include at least one metal-semiconductor compound. As an example, the source/drain electrodes 151 may be formed of or may otherwise include at least one metal silicide material, such as titanium silicide or nickel silicide. The source/drain electrodes 151 may be formed by a silicidation process. As an example, the formation of the source/drain electrodes 151 may include forming a metal layer on the first semiconductor patterns 141 and performing a thermal treatment process to form the metal-semiconductor compound. Thereafter, a remaining portion of the metal layer may be removed. For example, the formation of source/drain electrodes 151 may be performed in a manner of consuming an upper portion of the first semiconductor patterns 141.

A contact electrode 153 may be formed on the exposed portion of the semiconductor gate electrode layer 117. The contact electrode 153 may be formed of or may otherwise include at least one metal-semiconductor compound. As an example, the contact electrode 153 may be formed of or may otherwise include at least one metal silicide material, such as titanium silicide and/or nickel silicide. The contact electrode 153 and the source/drain electrodes 151 may be simultaneously formed by a single process. Thereafter, a process to form elements shown in FIG. 1 may be performed.

A semiconductor device, according to an exemplary embodiment of the present inventive concept, may include at least one transistor, which is configured to have the same features as that in each or any combination of the figures. For example, the transistors of FIGS. 1, 4, 5, 6, 8, and 9 may be combined with each other. As an example, the sixth transistor TR6 of FIG. 4 and the second transistor TR2 of FIG. 5 may be formed on the same substrate, or the third transistor TR3 of FIG. 6 and the fourth transistor TR4 of FIG. 8 may be formed on the same substrate. In certain embodiments, three or more transistors of the transistors of FIGS. 1, 4, 5, 6, 8, and 9 may be formed together on the same substrate.

According to an exemplary embodiment of the present inventive concept, a semiconductor device may be provided to include transistors with desired electric characteristics. According to an exemplary embodiment of the present inventive concept, it may be possible to reduce a process variation and complexity in a process of fabricating a semiconductor device. According to an exemplary embodiment of the present inventive concept, it may be possible to easily form transistors with various threshold voltages.

While exemplary embodiments of the present inventive concepts have been particularly shown and described in the figures and specification, it will be understood by one of ordinary skill in the art that variations in form and detail may be made therein without departing from the spirit and scope of the present disclosure.

What is claimed is:

1. A semiconductor device, comprising:
a substrate including a lower semiconductor layer, an insulating gapfill layer, and an upper semiconductor layer, sequentially stacked;
a gate structure on the upper semiconductor layer;
a source/drain electrode on a sidewall of the gate structure; and
a semiconductor pattern between the source/drain electrode and the upper semiconductor layer,
wherein the gate structure comprises a gate electrode and a spacer structure,
wherein the spacer structure comprises a first spacer pattern, a second spacer pattern, and a third spacer pattern sequentially disposed on a sidewall of the gate electrode, and wherein the semiconductor pattern is extended to a region below a bottom surface of the third spacer pattern and is connected to the second spacer pattern.

2. The device of claim 1, wherein the second spacer pattern comprises a sidewall portion, which extends primarily in a direction perpendicular to a top surface of the substrate, and a protruding portion, which protrudes from the sidewall portion toward the semiconductor pattern.

3. The device of claim 1, wherein a top surface of the semiconductor pattern is located at a level equal to or higher than the bottom surface of the third spacer pattern.

4. The device of claim 3, wherein the semiconductor pattern comprises:
a lower portion extended to a region below the bottom surface of the third spacer pattern; and
an upper portion connected to a sidewall of the third spacer pattern.

5. The device of claim 3, wherein the semiconductor pattern has a stepwise structure, in a region where the semiconductor pattern is connected to the third spacer pattern.

6. The device of claim 1, wherein the third spacer pattern is thicker than either the first spacer pattern or the second spacer pattern.

7. The device of claim 1, wherein the upper semiconductor layer is thinner than the source/drain electrode.

8. The device of claim 1, further comprising a source/drain region provided in the upper semiconductor layer and the semiconductor pattern,
wherein the source/drain region has a depth sufficient to reach a bottom surface of the upper semiconductor layer.

9. The device of claim 1, wherein the lower semiconductor layer comprises a lower impurity region, which is provided in an upper portion of the lower semiconductor layer adjacent to the insulating gapfill layer and is not electrically connected to the source/drain region.

10. The device of claim 9, further comprising an insulating isolation pattern, which penetrates the upper semiconductor layer and the insulating gapfill layer and is inserted into the upper portion of the lower semiconductor layer, and
wherein a bottom surface of the insulating isolation pattern is located at a level lower than a bottom surface of the lower impurity region.

11. The device of claim 1, further comprising an insulating isolation pattern, which penetrates the upper semiconductor layer and the insulating gapfill layer and is inserted into an upper portion of the lower semiconductor layer, and
wherein the semiconductor device comprises a gate region, in which the gate structure is provided, and a back-side bias region, which is spaced apart from the gate region with the insulating isolation pattern interposed therebetween,
wherein the back-side bias region comprises:
a pick-up impurity region provided in an upper portion of the lower semiconductor layer; and
a pick-up electrode on the pick-up impurity region.

12. The device of claim 1, wherein the insulating gapfill layer is thinner than the source/drain electrode.

13. A semiconductor device, comprising:
a substrate including a lower semiconductor layer, an insulating gapfill layer, and an upper semiconductor layer that are sequentially stacked;
a gate structure on the upper semiconductor layer;
a source/drain electrode on a sidewall of the gate structure; and
a semiconductor pattern between the source/drain electrode and the upper semiconductor layer,
wherein the gate structure comprises a gate electrode and a spacer structure,
wherein the spacer structure comprises a first spacer pattern, a second spacer pattern, and a third spacer pattern, which are sequentially disposed on a sidewall of the gate electrode, and
wherein the semiconductor pattern comprises an upper portion, which is connected to a sidewall of the third spacer pattern, and a lower portion, which is extended in a region below a bottom surface of the third spacer pattern and is connected to the second spacer pattern.

14. A semiconductor device, comprising
a substrate including a lower semiconductor layer, an insulating gapfill layer, and an upper semiconductor layer, that are sequentially stacked; and
a first transistor and a second transistor on the substrate,
wherein the first transistor comprises:
a first gate structure on the upper semiconductor layer;
a first source/drain electrode on a sidewall of the first gate structure; and
a first semiconductor pattern between the first source/drain electrode and the upper semiconductor layer,
wherein the first gate structure comprises a gate electrode and a first spacer structure,
wherein the first spacer structure comprises a first spacer pattern, a second spacer pattern, and a third spacer pattern, which are sequentially disposed on a sidewall of the gate electrode, and
wherein the first semiconductor pattern is extended to a region below a bottom surface of the third spacer pattern and is in contact with the second spacer pattern.

15. The device of claim 14, wherein the second transistor comprises a gate insulating layer that is disposed on the lower semiconductor layer and is thicker than the insulating gapfill layer.

16. The device of claim 14, wherein the second transistor comprises a source/drain region in an upper portion of the lower semiconductor layer.

17. The device of claim 14, wherein the second transistor comprises a second spacer structure including a first spacer pattern, a second spacer pattern, and a third spacer pattern,
wherein the second spacer pattern of the first transistor comprises a first protruding portion extended in a region below the third spacer pattern of the first transistor,
wherein the second spacer pattern of the second transistor comprises a second protruding portion extended in a region below the third spacer pattern of the first transistor, and
wherein a length of the second protruding portion is smaller than a length of the first protruding portion.

18. The device of claim 14, wherein the second transistor comprises:
a second gate structure on the upper semiconductor layer;
a second source/drain electrode on a sidewall of the second gate structure; and
a second semiconductor pattern between the second source/drain electrode and the upper semiconductor layer, and
wherein the second semiconductor pattern comprises a material different from the first semiconductor pattern.

19. The device of claim 14, wherein the first transistor comprises a first lower impurity region provided in an upper portion of the lower semiconductor layer adjacent to the insulating gapfill layer, wherein the second transistor comprises a second lower impurity region provided in an upper portion of the lower semiconductor layer adjacent to the insulating gapfill layer, and wherein a conductivity type of the second lower impurity region is different from a conductivity type of the first lower impurity region.

20. The device of claim 14, wherein the second transistor comprises:

a second gate structure on the upper semiconductor;

a second source/drain electrode on a sidewall of the second gate structure; and a second semiconductor pattern between the second source/drain electrode and the upper semiconductor layer, wherein a thickness of the upper semiconductor layer below the second semiconductor pattern is larger than a thickness of the upper semiconductor layer below the first semiconductor pattern.

21. A method of fabricating a semiconductor device, comprising:

forming a gate electrode on a substrate, in which a lower semiconductor layer, an insulating gapfill layer, and an upper semiconductor layer are sequentially stacked;

sequentially forming a first spacer layer and a second spacer layer on a sidewall of the gate electrode;

performing a first ion implantation process on the upper semiconductor layer;

forming a third spacer pattern on a sidewall of the second spacer layer;

removing a portion of the second spacer layer, below a bottom surface of the third spacer pattern, to form a recess region;

growing a first semiconductor pattern from the upper semiconductor layer, the first semiconductor pattern being extended to the recess region; and performing a second ion implantation process on the first semiconductor pattern and the upper semiconductor layer, wherein the first ion implantation process is performed before the forming of the third spacer pattern.

22. The method of claim 21, wherein the first ion implantation process and the second ion implantation process are performed to a depth corresponding to a bottom surface of the upper semiconductor layer.

23. The method of claim 21, further comprising forming a lower impurity region in an upper portion of the lower semiconductor layer, before the forming of the gate electrode.

24. The method of claim 21, wherein the first ion implantation process is performed between the forming of the second spacer layer and the forming of the third spacer pattern.

25. The method of claim 21, further comprising etching the first spacer layer to form a first spacer pattern, wherein the first ion implantation process is performed before the etching of the first spacer layer.

* * * * *